United States Patent
Kuo et al.

(10) Patent No.: US 9,628,261 B1
(45) Date of Patent: Apr. 18, 2017

(54) CARRIER GENERATOR, RADIO FREQUENCY INTERCONNECT INCLUDING THE CARRIER GENERATOR AND METHOD OF USING

(71) Applicant: TAIWAN SEMICONDUCTOR MANUFACTURING COMPANY, LTD., Hsinchu (TW)

(72) Inventors: Feng Wei Kuo, Zhudong Township (TW); Chewn-Pu Jou, Hsinchu (TW); Huan-Neng Chen, Taichung (TW); Lan-Chou Cho, Hsinchu (TW); William Wu Shen, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/969,286

(22) Filed: Dec. 15, 2015

(51) Int. Cl.
| H04L 7/02 | (2006.01) |
| H04L 7/033 | (2006.01) |
| H04L 27/00 | (2006.01) |
| H04L 7/027 | (2006.01) |

(52) U.S. Cl.
CPC .......... *H04L 7/0331* (2013.01); *H04L 7/027* (2013.01); *H04L 27/0014* (2013.01)

(58) Field of Classification Search
CPC ....... H04L 7/00; H04L 7/0004; H04L 7/0008; H04L 7/0012; H04L 7/0016; H04L 7/0033; H04L 7/0037; H04L 7/0054; H04L 7/04; H04L 7/041; H04L 7/048; H04L 7/10

USPC ....... 375/316, 354, 356, 371, 373, 374, 375, 375/376
See application file for complete search history.

(56) References Cited

U.S. PATENT DOCUMENTS

| 7,498,890 B2 * | 3/2009 | Wallberg ................. H03L 7/093 327/156 |
| 8,279,008 B2 | 10/2012 | Hsieh et al. |
| 8,427,240 B2 | 4/2013 | Hsieh et al. |
| 8,570,082 B1 * | 10/2013 | Kuo .......................... H03L 1/00 327/158 |
| 8,593,206 B2 | 11/2013 | Chen et al. |
| 8,610,494 B1 | 12/2013 | Jin et al. |
| 8,618,631 B2 | 12/2013 | Jin et al. |
| 2008/0192877 A1 * | 8/2008 | Eliezer .................. H03L 7/1806 375/376 |

(Continued)

*Primary Examiner* — Siu Lee
(74) *Attorney, Agent, or Firm* — Hauptman Ham, LLP

(57) ABSTRACT

A carrier generator includes a phase accumulator configured to receive a frequency command word (FCW) signal. The carrier generator includes an adder connected to the phase accumulator; and a loop filter configured to receive an output of the adder. The carrier generator includes a plurality of tuning arrangements, each tuning arrangement is configured to receive an output of the loop filter. Each tuning arrangement includes an electronic oscillator configured to receive the output of the loop filter. Each tuning arrangement includes a voltage controlled delay line (VCDL) configured to receive an output of the electronic oscillator, and to provide a tuning arrangement output. Each tuning arrangement includes a phase detector configured to receive a corresponding recovered clock signal and a feedback from a corresponding tuning arrangement output. Each tuning arrangement includes a counter configured to receive an output of the phase detector and to provide an output to the VCDL.

20 Claims, 5 Drawing Sheets

(56) References Cited

U.S. PATENT DOCUMENTS

| | | |
|---|---|---|
| 2012/0092230 A1 | 4/2012 | Hung et al. |
| 2013/0234305 A1 | 9/2013 | Lin et al. |
| 2014/0132333 A1 | 5/2014 | Jin et al. |
| 2014/0217546 A1 | 8/2014 | Yen et al. |
| 2014/0253262 A1 | 9/2014 | Hsieh et al. |
| 2014/0253391 A1 | 9/2014 | Yen |
| 2015/0318980 A1* | 11/2015 | Grollitsch ............ H04L 7/0331 375/376 |
| 2016/0056859 A1* | 2/2016 | Malhotra ............ H04J 3/0638 375/356 |

* cited by examiner

US 9,628,261 B1

CARRIER GENERATOR, RADIO FREQUENCY INTERCONNECT INCLUDING THE CARRIER GENERATOR AND METHOD OF USING

BACKGROUND

In a packaged integrated circuit, there are many individual devices such as a memory, an analog-to-digital converter, wireless communication devices, an application processor, and so forth. The individual devices communicate via a bus such as a Serial Peripheral Interface (SPI) or Inter-Integrated Circuit ($I^2C$). As bandwidth requirement of the individual devices increases, the bus limits the amount of data transmission between the devices. A radio frequency interconnect (RFI) has been implemented that links the devices to perform communication between the devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
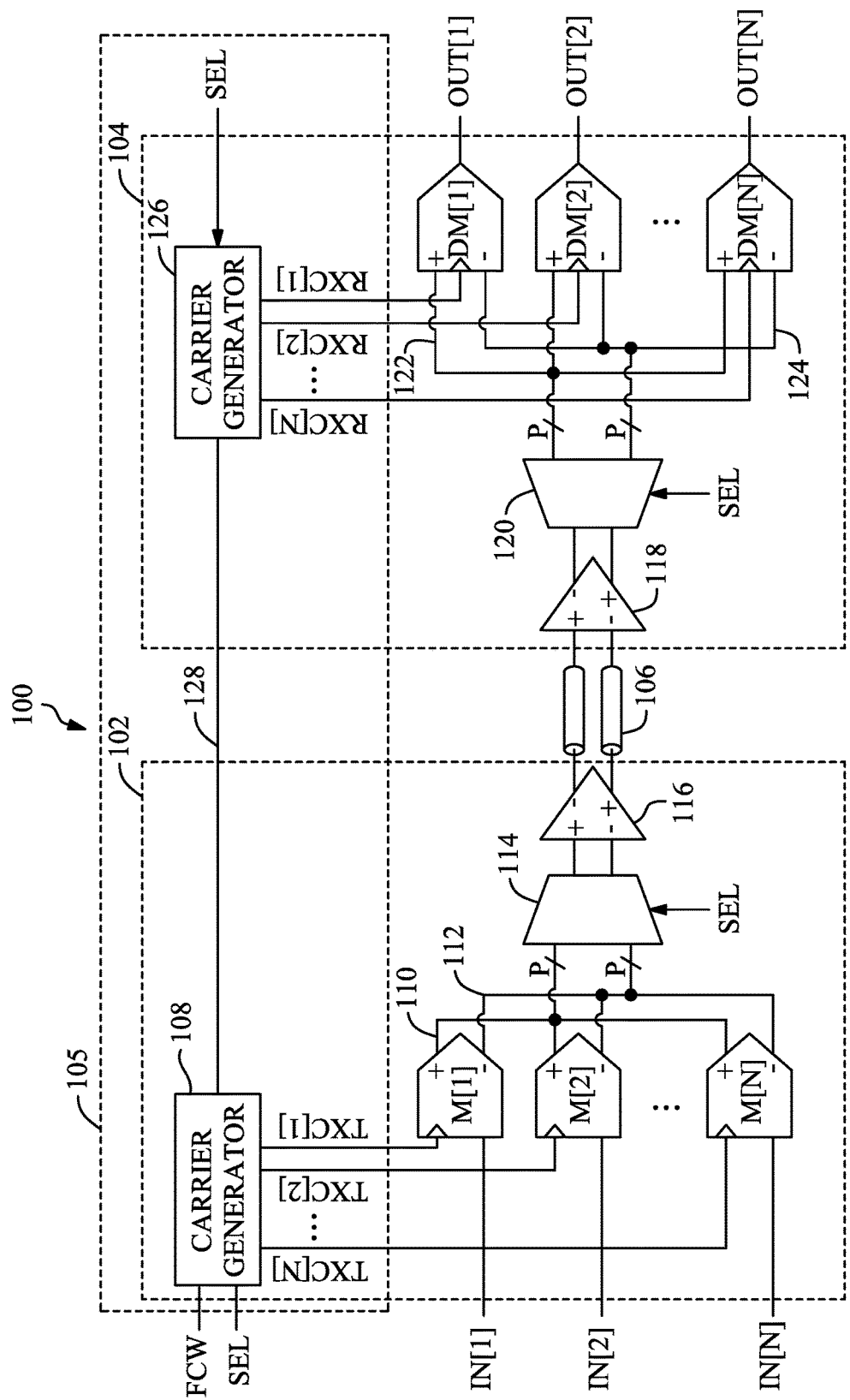
FIG. 1 is a block diagram of a radio frequency interconnect (RFI) that connects devices, in accordance with some embodiments.

The following disclosure provides different embodiments, or examples, for implementing features of the provided subject matter. Specific examples of components and arrangements are described below to simplify the present disclosure. These are, of course, merely examples and are not limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The radio frequency interconnect (RFI) discussed herein connects devices via a differential transmission line. In some embodiments, the individual components are on a single semiconductor substrate. In some embodiments, the individual components are on separate semiconductor substrates. In some embodiments, the individual devices include at least one of a memory device; a wireless communication device, e.g., a Bluetooth® module, a Zigbee® module, an IEEE 802.11 wireless networking module, or another suitable wireless communication device; an analog-to-digital converter, a digital-to-analog converter, a sensor module, a discrete application processor for performing operations in a low power state, a hardware processor, a memory controller, or another suitable device.

In some embodiments, a single device using a large bandwidth, e.g., a memory, is coupled to a processor via a differential transmission line. In some embodiments, two devices or more are coupled to the processor via a single differential transmission line. In some embodiments, the differential transmission line is a coplanar waveguide.

The RFI includes a transmitter and a receiver configured to link two or more devices via a transmission line to perform communication. The RFI also includes carrier synchronization section which includes a carrier generator configured to generate carrier signals and to generate a clock recovery signal from the carrier signals. The carrier signals are used to modulate data that is transmitted to at least one receiving device via the differential transmission line. A receiving device uses the clock recovery signal to regenerate the carrier signals and demodulate the received data via the regenerated carrier signals. The receiver uses a phase lock loop (PLL) to generate the clock recovery signal. In some embodiments, the receiver uses a single PLL to generate the clock recovery signal. The RFI is usable in different integrated circuits that are packaged via 2D, 2.5D, and 3D packaging techniques, thereby conserving space by reducing a number of electrical interconnects. Because the RFI replaces a bus having a large number of individual lines, power is saved and an area occupied on the integrated circuit is reduced.

FIG. 1 is a block diagram of a Radio Frequency Interconnect (RFI) 100 that connects devices, in accordance with some embodiments. RFI 100 includes a transmitter 102 that is coupled to a receiver 104 via a transmission line 106. RFI 100 also includes a carrier synchronization section 105 which connects transmitter 102 to receiver 104. Transmitter 102 includes data input terminals that are coupled to input data lines IN[1] to IN[N], collectively referred to as "input data lines IN", N is a positive integer equal to or greater than 2. Receiver 104 includes output terminals that are coupled to output data lines OUT[1] to OUT[N], collectively referred to as "output data lines OUT."

Transmitter 102 includes a carrier generator 108 having a first input configured to receive a frequency command word (FCW) signal and a second input configured to receive a selector (SEL) signal. Carrier generator 108 includes clock output terminals that are coupled to clock input terminals of modulators M[1] to M[N], collectively referred to as "modulators M," via carrier lines TXC[1] to TXC[N], collectively referred to as "carrier lines TXC," where M is a positive integer In some embodiments, carrier generator 108 includes a plurality of sub-carrier generators, where each sub-carrier generator is connected to a corresponding modulator of modulators M. In some embodiments, carrier generator 108 includes a multi-carrier generator connected to each of modulators M.

Modulators M include data input terminals that are coupled to the data input terminals of transmitter 102. Non-inverting output terminals of modulators M are coupled to a bus 110. Inverting output terminals of modulators M are coupled to a bus 112. Bus 110 has P bits and is coupled to a first set of input terminals of a multiplexer 114, where P is a positive integer. Bus 112 also has P bits and is coupled to a second set of input terminals of multiplexer 114.

Multiplexer 114 includes a select input terminal coupled to an external select source (not shown) and differential output terminals that are coupled to differential input terminals of a differential amplifier 116. The select input terminal is configured to receive the SEL signal. The differential output terminals of differential amplifier 116 are coupled to the differential output terminals of transmitter 102, which are coupled to input ports of transmission line 106. In some embodiments, differential amplifier 116 is a low noise amplifier.

The output ports of transmission line 106 are coupled to differential input terminals of receiver 104, which are coupled to differential input terminals of a differential amplifier 118. In some embodiments, differential amplifier 118 is a low noise amplifier. The output terminals of differential amplifier 118 are coupled to input terminals of a demultiplexer 120. A first set of output terminals of demultiplexer 120 are coupled to a bus 122 having P bits and a second set of output terminals of demultiplexer 120 are coupled to a bus 124 having P bits.

Receiver 104 includes a carrier generator 126 having clock output terminals that are coupled to a clock input of demodulators DM[1] to DM[N], collectively referred to as "demodulators DM," via carrier lines RXC[1] to RXC[N], collectively referred to as "carrier lines RXC". Non-inverting input terminals of demodulators DM are also coupled to bus 122 and inverting input terminal of demodulators DM[N] are coupled to bus 124. Output terminals of demodulators DM are coupled to the output terminals of receiver 104, which are coupled to the data output lines OUT. Carrier generator 126 is configured to receive the SEL signal. In some embodiments, carrier generator 126 includes a plurality of sub-carrier generators, where each sub-carrier generator is connected to a corresponding demodulator of demodulators DM. In some embodiments, carrier generator 126 includes a multi-carrier generator connected to each of demodulators DM.

A clock output terminal of Carrier generator 108 is also coupled to a clock input terminal of carrier generator 126 via line 128. In particular, line 128 is a single ended line for transmitting a clock recovery signal to receiver 104 to regenerate the carrier signals S. In some embodiments, carrier generator 108 includes a multiplexer connected to line 128. In some embodiments, carrier generator 126 includes a demultiplexer connected to line 128.

Transmitter 102 is configured receive input data via input data lines IN, modulate the input data based on a different carrier signal for each of the input data lines IN, and transmit the modulated data to receiver 104. Specifically, the carrier generator 108 receives FCW signal on the first input terminal and SEL signal on the second input terminal. The SEL signal is configured to divide a time period $T_{PERIOD}$ into time slots T[1] to T[N], collectively referred to as "time slots T". In response to the FCW signal, carrier generator 108 is configured to generate carrier frequencies S[1] to S[N], collectively referred to as "carrier signals S," and output the carrier frequencies S to the clock input terminals of modulators M. For example, based on the FCW signal and modulator M[n], n being an index ranging from 1 to N, carrier generator 108 generates a carrier signal S[n] and transmits the carrier signal S[n] to the modulator M[n] via carrier line TXC[n]. In some embodiments, the FCW signal is a ratio of a desired frequency divided by a reference frequency. Each of the carrier signals S on the carrier lines TXC is a continuous wave signal having a different fundamental frequency.

Carrier generator 108 is also configured to generate a clock recovery signal $S_{REF}$ by time-multiplexing each of the carrier signals S for a predetermined interval, i.e., a time slot, in time period $T_{PERIOD}$, with time period $T_{PERIOD}$ being divided into time slots T. Specifically, based on the SEL signal, carrier generator 108 sequentially outputs a carrier signal S[n] in a time slot T[n], thereby causing carrier generator 108 to time-multiplex the carrier signals S into the clock recovery signal $S_{REF}$, where n is a positive integer. Clock recovery signal $S_{REF}$ is output from carrier generator 108 on line 128 to carrier generator 126.

Modulator M[n] receives the data for transmission via input line IN[n] for transmission to receiver 104. In response to receiving the carrier signal S[n] on the clock input terminal, modulator M[n] modulates the input data based on the carrier signal on carrier line TXC[n], and outputs the modulated data as a differential signal on bus 110 and bus 112. The modulator[n] is configured to modulate the input data based on a Quadrature Amplitude Modulation (QAM) scheme having 256 symbols, i.e., 256-QAM. In some embodiments, another modulation scheme is used or a different number of symbols is implemented, e.g., 64-QAM, 1024-QAM. In some embodiments, a phase shift key scheme is implemented to improve noise performance.

Multiplexer 114 receives the modulated data from modulators M via bus 110 and 112 and receives the select signal SEL via the select input terminal. In response to the select signal SEL, multiplexer 114 selects modulator M[n] for a time slot T[n] and outputs the modulated data from the selected modulator M[n] during the time slot T[n]. As a result, multiplexer 114 receives the modulated data from each modulator M, time-multiplexes the modulated data for each modulator M during time period $T_{PERIOD}$, and outputs the multiplexed data. Differential amplifier 116 receives the multiplexed data, amplifies the time-multiplexed data for transmission, and transmits the amplified data to receiver 104 via the transmission line 106.

Receiver 104 is configured to demodulate the received data from the transmitter 102 by regenerating the carrier signals S. Specifically, carrier generator 126 receives the clock recovery signal $S_{REF}$ on line 128 via the first input terminal and the SEL signal via the second input terminal. In response to the clock recovery signal $S_{REF}$ and the SEL signal, carrier generator 126 regenerates the carrier signals S and outputs the carrier signals S on the carrier lines RXC.

The differential input terminals of differential amplifier 118 receive the transmitted data from transmitter 102 via output ports of transmission line 106. In response to receiving the data, differential amplifier 118 amplifies the received data and outputs the amplified data. Demultiplexer receives the amplified data via the differential input terminals and receives the SEL signal via the select input terminal.

In response to the SEL signal during each time period $T_{PERIOD}$, demultiplexer 120 sequentially selects and outputs the amplified signal to demodulators DM via bus 122 and bus 124. For example, during time slot T[n], demultiplexer 120 selects an output terminal coupled to bus 122 that is coupled to the non-inverting input of demodulator DM[n] and an output terminal coupled to bus 124 that is coupled to the inverting input terminal of demodulator DM[n]. In response to selecting the output terminals, demultiplexer 120 outputs the amplified signal to the selected demodulator DM[n] during the corresponding time slot T[n]. Demodulators DM receive the amplified signal for a single time slot from the time slots T and receive the carrier signals S on carrier lines RXC. In response to receiving the amplified signal, demodulators DM demodulate the amplified signal based on the carrier signals S and output the transmitted data on data output lines OUT.

Figure 2A:
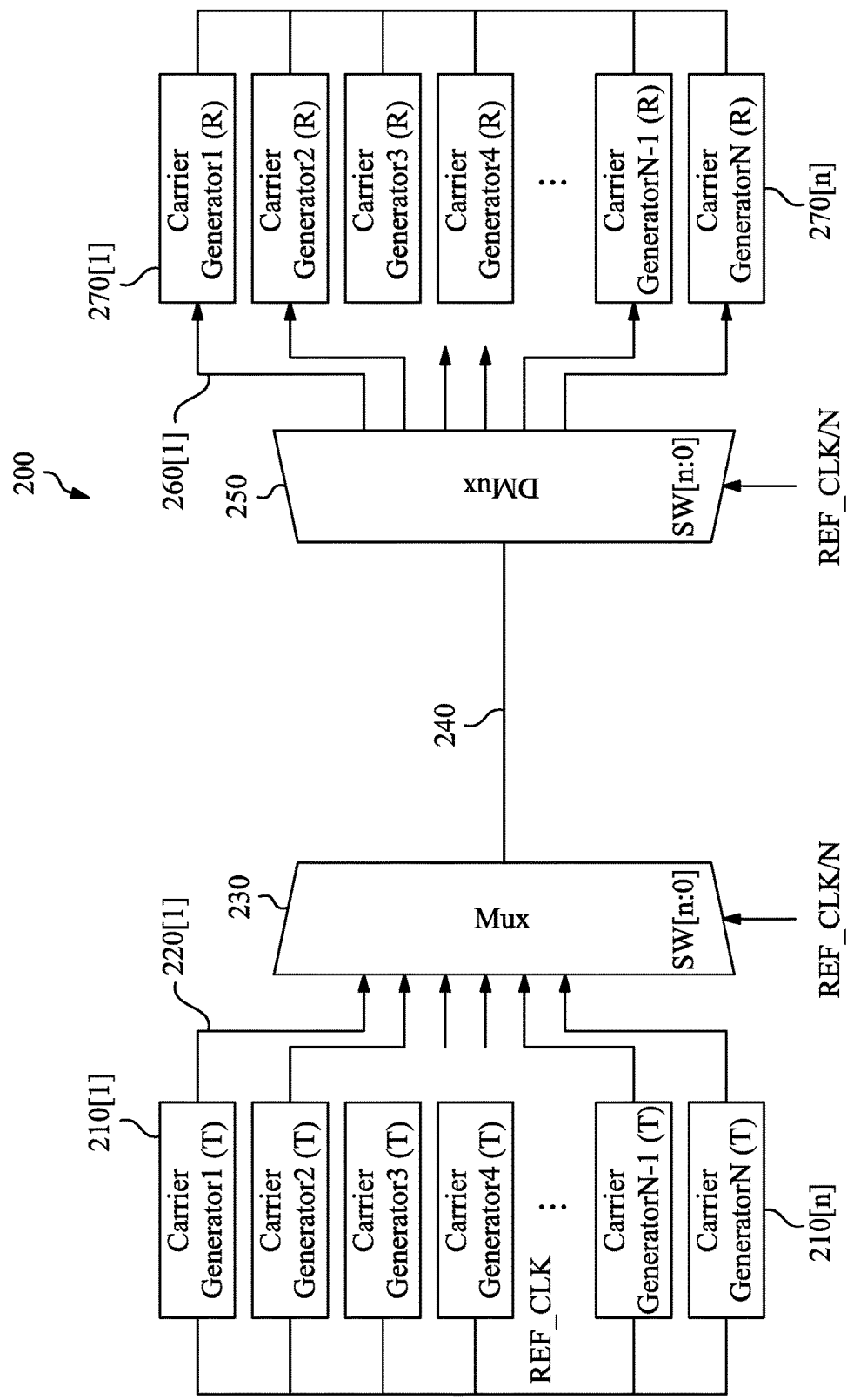
FIG. 2A is a block diagram of a carrier synchronization channel for a RFI in accordance with some embodiments.

FIG. 2A is a block diagram of a carrier synchronization section 200 of an RFI in accordance with some embodiments. In some embodiments, carrier synchronization section 200 is usable as carrier synchronization section 105 in RFI 100 (FIG. 1). Carrier synchronization section 200 includes a plurality of carrier generators 210[1] to 210[n], collectively referred to as carrier generators 210. Each carrier generator 210[1] to 210[n] is configured to generate a reference carrier signal. Each carrier generator 210[1] to 210[n] is connected to a multiplexer 230 by a corresponding line 220 [1] to 220[n], collectively referred to as lines 220. Carrier generators 210 are also configured to generate carrier signals for modulators in the RFI, e.g., modulators M in RFI 100. A selector input of multiplexer 230 is configured to receive a divided reference clock signal REF_CLK/N. Multiplexer 230 is configured to transmit reference carrier signals from a corresponding carrier generator 210 along a line 240 in a time division multiplexing scheme. In some embodiments, carrier generators 210 are combined into a single multi-carrier generator. In some embodiments, carrier generators 210, lines 220 and multiplexer 230 are combined into a single carrier generator arrangement, e.g., carrier generator 108 (FIG. 1).

Line 240 connects multiplexer 230 with a demultiplexer 240. Demultiplexer 240 is configured to receive the divided reference clock signal REF_CLK/N at a selector input. Demultiplexer 240 is configured to output separated reference carrier signals to corresponding carrier generators 270[1] to 270[n], collectively referred to as carrier generators 270, along lines 260[1] to 260[n], collectively referred to as lines 260. Carrier generators 260 are configured to output carrier signals to demodulators of the RFI, e.g., demodulators DM of RFI 100 (FIG. 1). In some embodiments, carrier generators 270 are combined into a single multi-carrier generator. In some embodiments, carrier generators 270, lines 260 and demultiplexer 250 are combined into a single carrier generator arrangement, e.g., carrier generator 126 (FIG. 1).

Figure 2B:
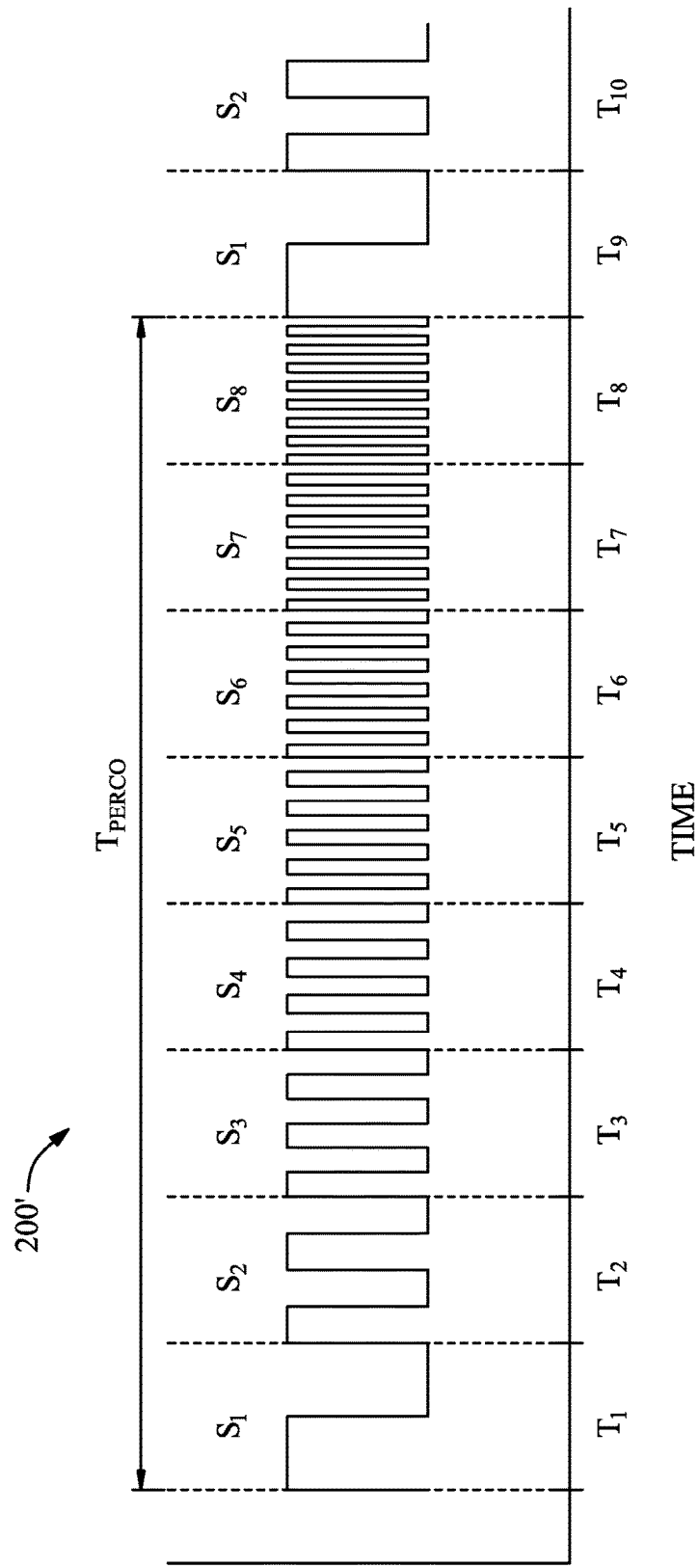
FIG. 2B is a timing diagram showing a clock recovery signal generated by the carrier generator, in accordance with some embodiments

FIG. 2B is a timing diagram 200' showing a clock recovery signal $S_{REF}$ generated by a carrier generator of an RFI in accordance with some embodiments. In some embodiments, clock recovery signal $S_{REF}$ is generated by carrier generators 210, lines 220 and multiplexer 230 (FIG. 2A). In some embodiments, clock recovery signal $S_{REF}$ is generated by carrier generator 108 (FIG. 1).

Clock recovery signal $S_{REF}$ includes reference carrier signals S that are time-multiplexed and transmitted during every time period $T_{PERIOD}$, which is divided in into time slots T. Each time slot T[n] in time slots T has a substantially equal time duration and carries a single reference carrier signal S[n] from carrier signals S, and each of the reference carrier signals S has a different frequency. In some embodiments, any one of reference carrier signals S is another continuous wave signal, e.g., a sinusoidal waveform, a triangle waveform, or another suitable waveform. After time period $T_{PERIOD}$ (i.e., time period T[N+1]), clock recovery signal $S_{REF}$ is continually generated and transmitted beginning with carrier signal S[1] at time period T[N+1]. In some embodiments, at least one time slot T[n] has a different time duration.

Figure 3:
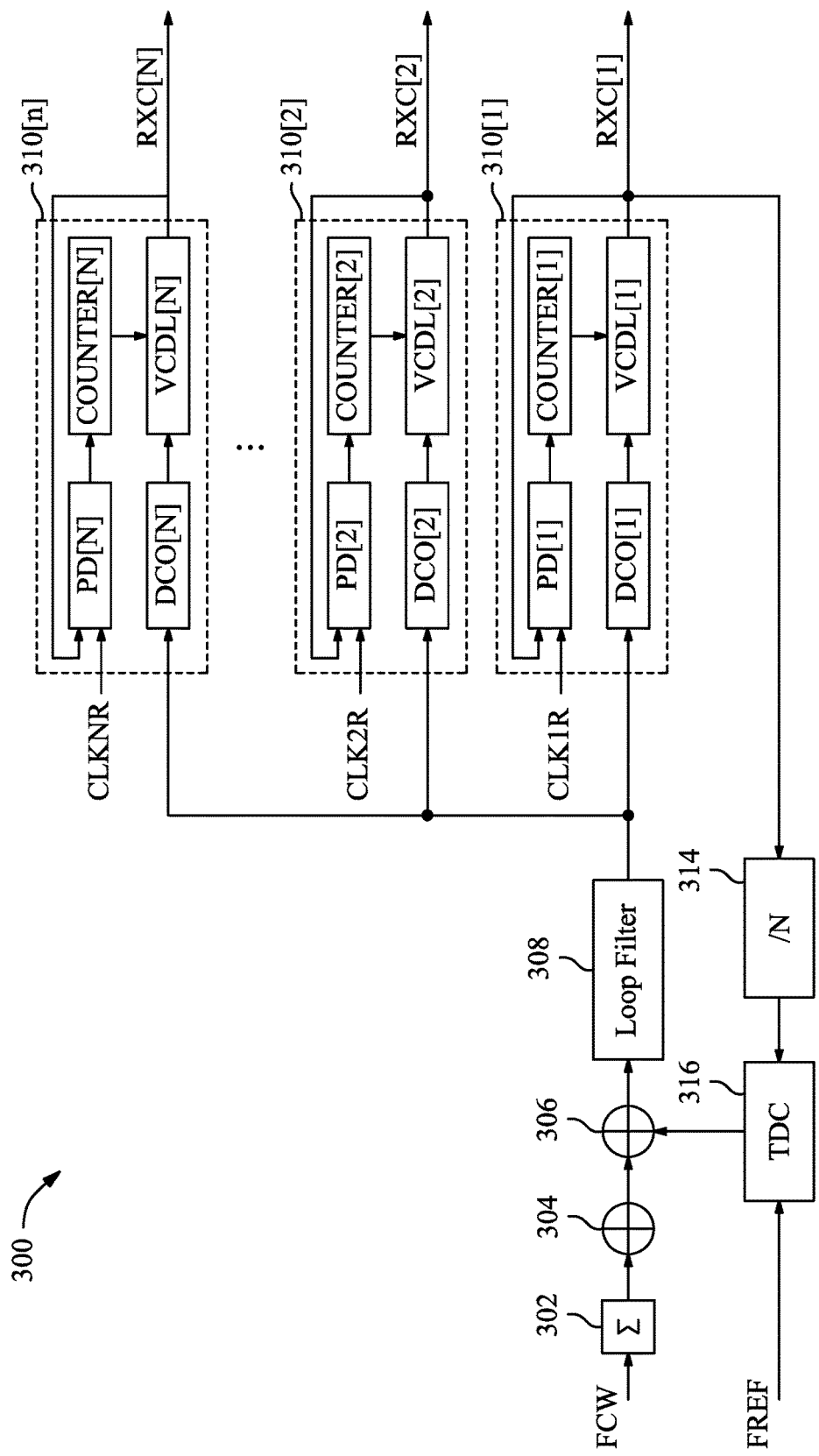
FIG. 3 is a block diagram of a carrier generator for generating output carrier signals in an RFI in accordance with some embodiments.

FIG. 3 is a block diagram of a carrier generator 300 for generating output carrier signals S in an RFI in accordance with some embodiments. In some embodiments, the RFI is RFI 100 (FIG. 1). In some embodiments, the RFI includes carrier synchronization section 200 (FIG. 2A). Carrier generator 300 includes a PLL for each received clock signal. The PLL helps to increase an amplitude of the received clock signal in order to account for signal loss during transmission along a line of the RFI, e.g., line 128. The PLL also helps to account for any phase shift in the received clock signal resulting from transmission through the line of the RFI.

Carrier generator 300 includes a first input terminal coupled to an input terminal of a phase accumulator 302. An output terminal of phase accumulator 302 is coupled to an input terminal of an adder 304. An output terminal of adder 304 is coupled to a first input of an adder 306. An output terminal of adder 306 is coupled to an input terminal of a loop filter 308. An output terminal of loop filter 308 is coupled to an input terminal of tuning arrangements 310[1] to 310[n], collectively referred to as tuning arrangements 310. An output terminal of tuning arrangement 310[1] is connected to an input of a divider 314. An output terminal of divider 314 is connected to an input terminal of time to digital converter (TDC) 316. An output of each tuning arrangement 310[1] to 310[n] is provided to a corresponding demodulator of the RFI, e.g., demodulators DM of RFI 100 (FIG. 1).

Each tuning arrangement 310[1] to 310 [n] includes a digital controlled oscillator (DCO) having an input terminal for receiving the output of loop filter 308. In some embodiments, the DCO is replaced by a voltage controlled oscillator (VCO) for an analog circuit arrangement. The DCO is used to provide coarse adjustment of the carrier signal output by tuning arrangements 310. A voltage controlled delay line (VCDL) has an input terminal for receiving an output of the DCO. The VCDL is also configured to receive an output from a counter. The VCDL is configured to provide fine adjustments to the carrier signal output by tuning arrangements 310. The counter has an input terminal configured to receive an output from a phase detector (PD). The PD includes a first input terminal for receiving the output of the corresponding tuning arrangement 310[1] to 310[n]. The PD includes a second input terminal for receiving a received clock signal from a demultiplexer, e.g., demultiplexer 250 (FIG. 2A). The received clock signal for each tuning arrangement 310[1] to 310[n] corresponds to a clock within a specific time period, e.g. T1-T8 (FIG. 2B), of a reference carrier signal received by a receiver of the RFI.

Including multiple tuning arrangements 310[1] to 310[n] enables carrier generator 300 to receive multiple received clock signals and provide carrier signals to multiple demodulators with a reduced circuit size in comparison with other approaches. In some embodiments, each carrier generator includes a single tuning arrangement 310[1] to 310 [n]. However, by sharing phase accumulator 302, adder 304, adder 306, loop filter 308, divider 314 and TDC 316 across multiple tuning arrangements 310, carrier generator 300 has a reduced size in comparison with other approaches. For example, an RFI which includes multiple carrier generators, e.g., carrier generators 270 (FIG. 2A), and each carrier generator has a separate PLL, a total size of the carrier generators is greater than carrier generator 300.

The operation of the carrier generator 300 starts when phase accumulator 302 receives a FCW signal via the first input terminal. In response to the FCW signal, phase accumulator 302 generates a phase reference signal based on the FCW and outputs the phase reference signal. Adder 304 receives the phase reference signal, adds a predetermined corrective value, and outputs the corrected signal. The predetermined corrective value is a corrective signal that is applied to correct errors that will affect each of the carrier signals S. In some embodiments, adder 304 is omitted. Adder 306 receives the corrected signal via the first input terminal and a feedback signal generated by TDC 316 via the second input terminal. In response to the corrected signal and the feedback signal, adder 306 adds the corrected signal to the feedback signal to generate a frequency command signal, and outputs the frequency command signal. Loop filter 308 receives the frequency command signal, filters the frequency command signal, and outputs the filtered command signal. In some embodiments, loop filter 308 is a low pass filter configured to pass frequencies below a threshold cutoff frequency.

The filtered command signal is provided to each tuning arrangement 310[1] to 310[n]. The respective DCO in each tuning arrangement 310[1] to 310[n] outputs a coarse adjustment signal. The coarse adjustment signal is received by the respective VCDL; and the VCDL outputs a carrier signal based on the received input from the respective counter and the coarse adjustment signal. The carrier signal is fed back to the respective PD for comparison with a corresponding received clock signal of the RFI. The result of the comparison in the PD is supplied to the respective counter. While the carrier generator 300 is operational, each tuning arrangement 310[1] to 310[n] is configured to continually output a respective carrier signal.

Divider 314 also receives the clock recovery signal $S_{REF}$, divides the clock recovery signal $S_{REF}$ by a division integer, and outputs the divided signal. In some embodiments, the division integer is a fixed integer. In some embodiments, the division integer is programmable integer and is determined from an input control signal, such as the SEL signal.

TDC 216 receives the divided signal and also receives a frequency reference (FREF) signal via the second input terminal. In response to the frequency reference FREF and the divided signal, TDC 216 generates a feedback signal to correct the phase of DCOs within the tuning arrangements 310. TDC 216 outputs the feedback signal to the adder 306, which receives the feedback signal to correct the carrier signals TXC.

Figure 4:
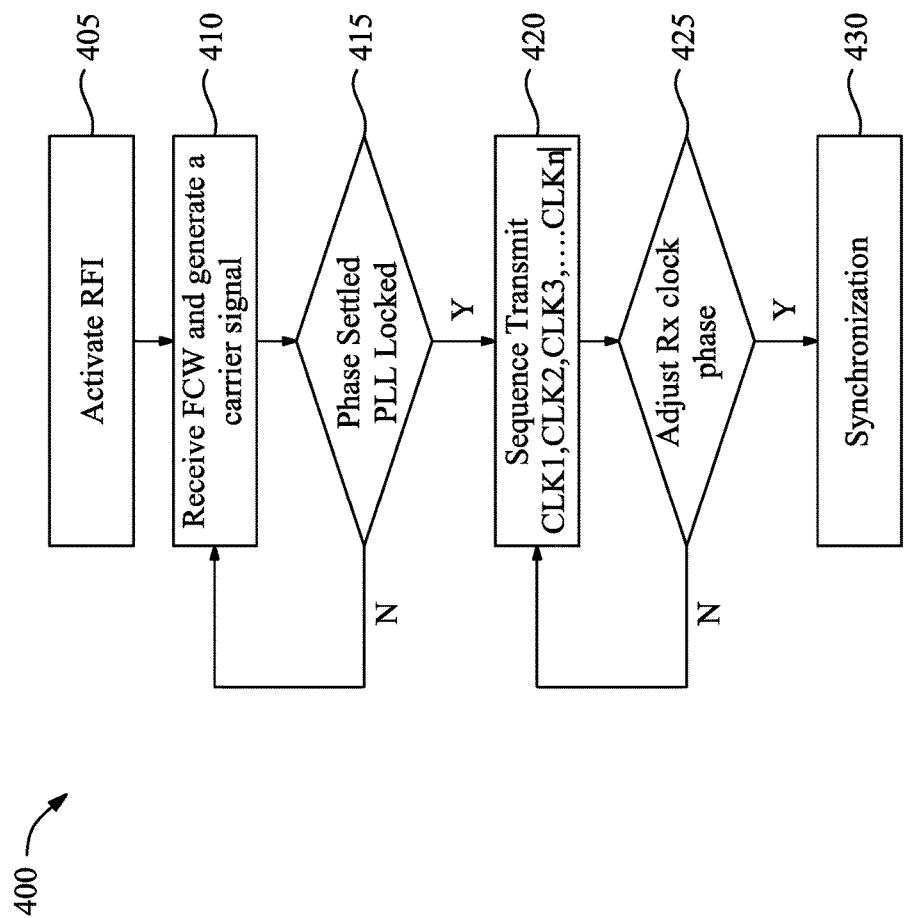
FIG. 4 is a flowchart of a method of synchronizing a transmitter and a receiver for transmission of data in a RFI, in accordance with some embodiments.

FIG. 4 is a flowchart of a method of synchronizing a transmitter and a receiver for transmission of data in a RFI in accordance with some embodiments. In some embodiments, method 400 is applicable to the circuits and signals illustrated in conjunction with RFI 100 (FIG. 1), carrier synchronization section 200 (FIG. 2A) or carrier generator 300 (FIG. 3).

The method 400 begins with operation 405, in which an RFI is activated. For a period of time following activation of the RFI a transmitter, e.g., transmitter 102 (FIG. 1), and a receiver, e.g., receiver 104, will be out of sync. During this start-up period a PLL of a carrier generator, e.g., carrier generator 126, carrier generators 270 (FIG. 2A) or carrier generator 300 (FIG. 3), will attempt to lock a carrier signal output to demodulators of the RFI with received clock signals based on a reference carrier signal.

Method 400 continues with operation 410, where a frequency source, such as a carrier generator, receives a FCW and generates a carrier signal based on the FCW. The FCW is an estimate of an input frequency. The carrier generator, e.g., carrier generator 126 (FIG. 1), carrier generators 270 (FIG. 2A) or carrier generator 300 (FIG. 3), will attempt to lock the carrier signal output to demodulators of the RFI to the FCW.

In comparison 415, the carrier signals output to demodulators are compared with the FCW to determine whether the PLL of the carrier generator has successfully locked the carrier signal to the FCW. If comparison 415 determines that the PLL has not successfully locked the carrier signal to the FCW, then method 400 returns to operation 410. If the comparison 415 determines the PLL has successfully locked the carrier signal to the FCW then method 400 continues with operation 420. In some embodiments, comparison 415 determines that the carrier signal is locked to the FCW if an error between a frequency and a phase of the carrier signal and a frequency and a phase of the FCW is within a predetermined range. In some embodiments, the predetermined range is selected by a user. In some embodiments, the predetermined range is based on a frequency of the FCW. In some embodiments, a counter is used to determine number of iterations of comparison 415 in method 400. If the number of comparison exceeds a threshold value, indicating the PLL is on a run away and unlikely to lock the carrier signal to the FCW, then the RFI is restarted and the counter is reset to zero. Runaway occurs when a frequency of an output of PLL is so high that a divider in the PLL fails to accurately respond to the output frequency, i.e., an output frequency that is too high causes a PLL to diverge from the FCW instead of converging to the FCW, in some instances.

In operation 420, a clock recovery signal is generated and transmitted. The clock recovery signal is transmitted within the RFI in a time division multiplexing scheme. The clock recovery signal includes a plurality of clock signals, e.g., CLK1, CLK2, CK3, . . . CLKn. Each clock signal is transmitted within a corresponding time slot, e.g., time slots T1-T8 (FIG. 2B), from the transmitter to the receiver of the RFI.

Method 400 proceeds to operation 425, where a carrier generator of the receiver adjusts carrier signals based on the received clock recovery signal. After adjusting the carrier signal, operation 425 determines if the frequency and the phase of the carrier signal are settled within a predetermined range of the received clock recovery signal. If the frequency and the phase of the carrier signal are not settled within the predetermined range of the received clock recovery signal, the method returns to operation 420 to continue transmitting and receiving the clock recovery signal. If the frequency and the phase of the regenerated carrier signal are settled within the predetermined range of the received clock recovery signal, the method proceeds to operation 430.

In operation 430, the method determines that the carrier signals of the receiver are synchronized with the carrier signals of the transmitter and, therefore, data transmission can begin because the receiver is able to precisely demodulate the transmitted data using the carrier signals of the receiver.

One aspect of this description relates to a carrier generator. The carrier generator includes a phase accumulator configured to receive a frequency command word (FCW) signal. The carrier generator further includes an adder connected to the phase accumulator; and a loop filter configured to receive an output of the adder. The carrier generator further includes a plurality of tuning arrangements, wherein each tuning arrangement of the plurality of tuning arrangements is configured to receive an output of the loop filter. Each tuning arrangement of the plurality of tuning arrangements includes an electronic oscillator configured to receive the output of the loop filter. Each tuning arrangement further includes a voltage controlled delay line (VCDL) configured to receive an output of the electronic oscillator, and to provide a tuning arrangement output. Each tuning arrangement further includes a phase detector configured to receive a corresponding recovered clock signal and a feedback from a corresponding tuning arrangement output. Each tuning arrangement further includes a counter configured to receive an output of the phase detector and to provide an output to the VCDL.

Another aspect of this description relates to a radio frequency interconnect (RFI). The RFI includes a transmitter configured to transmit data and a receiver configured to receive the data. The receiver includes a carrier generator. The carrier generator includes a phase accumulator configured to receive a frequency command word (FCW) signal. The carrier generator further includes an adder connected to the phase accumulator; and a loop filter configured to receive an output of the adder. The carrier generator further includes a plurality of tuning arrangements, wherein each tuning arrangement of the plurality of tuning arrangements is configured to receive an output of the loop filter. Each tuning arrangement of the plurality of tuning arrangements includes an electronic oscillator configured to receive the output of the loop filter. Each tuning arrangement further includes a voltage controlled delay line (VCDL) configured to receive an output of the electronic oscillator, and to provide a tuning arrangement output. Each tuning arrangement further includes a phase detector configured to receive a corresponding recovered clock signal and a feedback from a corresponding tuning arrangement output. Each tuning arrangement further includes a counter configured to receive an output of the phase detector and to provide an output to the VCDL.

Still another aspect of this description relates to a method of synchronizing a carrier signal in a radio frequency interconnect (RFI). The method includes activating the RFI; and determining whether a carrier signal generated by a carrier generator is locked with a frequency command word (FCW) signal. The method further includes receiving a clock recovery signal when carrier signal is locked with the FCW signal. The method further includes adjusting the carrier signal based on the clock recovery signal; and receiving data from a transmitter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A carrier generator comprising:
   a phase accumulator configured to receive a frequency command word (FCW) signal;
   an adder connected to the phase accumulator;
   a loop filter configured to receive an output of the adder; and
   a plurality of tuning arrangements, wherein each tuning arrangement of the plurality of tuning arrangements is configured to receive an output of the loop filter, and each tuning arrangement of the plurality of tuning arrangements comprises:
     an electronic oscillator configured to receive the output of the loop filter;
     a voltage controlled delay line (VCDL) configured to receive an output of the electronic oscillator, and to provide a tuning arrangement output;
     a phase detector configured to receive a corresponding recovered clock signal and a feedback from a corresponding tuning arrangement output; and
     a counter configured to receive an output of the phase detector and to provide an output to the VCDL.

2. The carrier generator of claim 1, wherein the electronic oscillator is a digital controlled oscillator (DCO).

3. The carrier generator of claim 1, wherein the electronic oscillator is a voltage controlled oscillator (VCO).

4. The carrier generator of claim 1, wherein a frequency of a recovered clock signal receivable by the phase detector of each tuning arrangement of the plurality of tuning arrangements is different.

5. The carrier generator of claim 1, wherein an amplitude of the received clock signal receivable by the phase detector of a first tuning arrangement of the plurality of tuning arrangements is different from an amplitude of the received clock signal receivable by the phase detector of a second tuning arrangement of the plurality of tuning arrangements.

6. The carrier generator of claim 1, further comprising a correcting adder between the phase accumulator and the adder.

7. The carrier generator of claim 6, wherein the correcting adder is configured to combine an output of the phase accumulator with a predetermined correction value.

8. The carrier generator of claim 1, further comprising a time to digital converter (TDC) configured to receive a divided output from a first tuning arrangement of the plurality of tuning arrangements.

9. The carrier generator of claim 8, wherein the adder is configured to receive an output of the TDC.

10. A radio frequency interconnect (RFI) comprising:
    a transmitter configured to transmit data; and
    a receiver configured to receive the data from the transmitter, wherein the receiver comprises a carrier generator, and the carrier generator comprises:
      a phase accumulator configured to receive a frequency command word (FCW) signal;
      an adder connected to the phase accumulator;
      a loop filter configured to receive an output of the adder; and
      a plurality of tuning arrangements, wherein each tuning arrangement of the plurality of tuning arrangements is configured to receive an output of the loop filter, and each tuning arrangement of the plurality of tuning arrangements comprises:
        an electronic oscillator configured to receive the output of the loop filter;
        a voltage controlled delay line (VCDL) configured to receive an output of the electronic oscillator, and to provide a tuning arrangement output;
        a phase detector configured to receive a corresponding recovered clock signal and a feedback from a corresponding tuning arrangement output; and
        a counter configured to receive an output of the phase detector and to provide an output to the VCDL.

11. The RFI of claim 10, wherein the transmitter is configured to transmit a clock recovery signal, and the corresponding recovered clock signal receivable by the phase detector is based on the clock recovery signal.

12. The RFI of claim 11, wherein the receiver comprises a demultiplexer configured to receive the clock recovery signal and to provide the received clock signal to the phase detector of each tuning arrangement of the plurality of tuning arrangements.

13. The RFI of claim 10, wherein the electronic oscillator is a digital controlled oscillator (DCO).

14. The RFI of claim 10, wherein the electronic oscillator is a voltage controlled oscillator (VCO).

15. The RFI of claim 10, wherein the carrier generator further comprises a time to digital converter (TDC) configured to receive a divided output from a first tuning arrangement of the plurality of tuning arrangements.

16. The RFI of claim 10, further comprising a carrier synchronization section, wherein the carrier synchronization section comprises a transmitting carrier generator in the transmitter and the carrier generator.

17. A method of synchronizing a carrier signal in a radio frequency interconnect (RFI), the method comprising:
   activating the RFI;
   determining whether the carrier signal generated by a carrier generator is locked with a frequency command word (FCW) signal, the carrier signal being one carrier signal of a plurality of carrier signals generated concurrently by the carrier generator;
   receiving a clock recovery signal when the carrier signal is locked with the FCW signal;
   adjusting the carrier signal based on the clock recovery signal; and
   receiving data from a transmitter.

18. The method of claim 17, wherein receiving the clock recovery signal comprises receiving a plurality of time multiplexed clock signals.

19. The method of claim 17, wherein determining whether the carrier signal is locked with the FCW signal comprises determining whether a frequency and a phase of the carrier signal is within a predetermined range of a frequency and a phase of the FCW signal.

20. The method of claim 17, further comprising determining whether a frequency and a phase of the carrier signal is settled within a predetermined range of a frequency and a phase of the clock recovery signal prior to receiving the data.

* * * * *